(12) United States Patent
Chao et al.

(10) Patent No.: US 11,810,484 B2
(45) Date of Patent: Nov. 7, 2023

(54) SPLICED DISPLAY

(71) Applicant: Industrial Technology Research Institute, Hsinchu (TW)

(72) Inventors: Chia-Hsin Chao, Hsinchu County (TW); Ming-Hsien Wu, Tainan (TW); Yen-Hsiang Fang, New Taipei (TW); Po-Hsun Wang, Hsinchu (TW); Li-Chun Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 17/483,812

(22) Filed: Sep. 24, 2021

(65) Prior Publication Data

US 2022/0036776 A1 Feb. 3, 2022

Related U.S. Application Data

(63) Continuation-in-part of application No. 16/231,404, filed on Dec. 22, 2018, now abandoned.

(51) Int. Cl.
*G09F 9/302* (2006.01)
*G09G 3/32* (2016.01)
(Continued)

(52) U.S. Cl.
CPC ............ *G09F 9/3026* (2013.01); *G09G 3/32* (2013.01); *H01L 27/142* (2013.01);
(Continued)

(58) Field of Classification Search
CPC ................................. G09G 3/32; G09F 9/3026
(Continued)

(56) References Cited

U.S. PATENT DOCUMENTS 5,808,710 A * 9/1998 Pierson ............... G02F 1/1345
349/149
2010/0066713 A1 * 3/2010 Katsu ..................... H05B 45/20
345/207

(Continued)

FOREIGN PATENT DOCUMENTS

CN 201107508 8/2008
CN 101866910 10/2010
(Continued)

OTHER PUBLICATIONS

"Office Action of Taiwan Related Application, Application No. 108135742", dated Nov. 22, 2021, p. 1-p. 14.
(Continued)

*Primary Examiner* — Calvin C Ma
(74) *Attorney, Agent, or Firm* — JCIPRNET

(57) ABSTRACT

A spliced display including a transparent substrate, a plurality of micro (light-emitting diodes) LEDs, and a plurality of light sensors is provided. The transparent substrate has a display surface and a back surface opposite to each other. The driving backplanes are disposed on the back surface of the transparent substrate to be spliced with each other. The micro LEDs are disposed on the driving backplanes respectively and located between the micro LEDs and the transparent substrate. Each of the driving backplanes is corresponding to parts of the micro LEDs. The light sensors are disposed on the transparent substrate and located between the driving backplanes and the transparent substrate. Each of the light sensors is adjacent to at least two of the micro LEDs, and at least one of the at least two of the micro LEDs is adjacent to two of the light sensor.

20 Claims, 13 Drawing Sheets

(51) Int. Cl.
  *H01L 27/15* (2006.01)
  *H01L 27/142* (2014.01)
  *H01L 33/62* (2010.01)

(52) U.S. Cl.
  CPC ............ *H01L 27/156* (2013.01); *H01L 33/62* (2013.01); *G09G 2300/026* (2013.01)

(58) Field of Classification Search
  USPC .................................... 345/46, 87, 173, 174
  See application file for complete search history.

(56) References Cited

U.S. PATENT DOCUMENTS

| 2013/0279012 | A1 | 10/2013 | Lee et al. | |
|---|---|---|---|---|
| 2014/0056003 | A1 | 2/2014 | Frattalone | |
| 2014/0259634 | A1* | 9/2014 | Cox | G06F 3/1446 29/729 |
| 2017/0025593 | A1* | 1/2017 | Bower | H10K 59/18 |
| 2017/0047393 | A1 | 2/2017 | Bower et al. | |
| 2017/0140679 | A1* | 5/2017 | Tomoda | G09F 9/3026 |
| 2018/0191978 | A1* | 7/2018 | Cok | H04N 25/74 |
| 2019/0019443 | A1* | 1/2019 | Shi | G06F 3/1446 |
| 2019/0258346 | A1 | 8/2019 | Cheng et al. | |

FOREIGN PATENT DOCUMENTS

| CN | 103296017 | 9/2013 |
|---|---|---|
| CN | 103714744 | 4/2014 |
| CN | 203631088 | 6/2014 |
| CN | 105405360 | 3/2016 |
| CN | 105761635 | 7/2016 |
| TW | 569268 | 1/2004 |
| TW | 201810755 | 3/2018 |
| WO | 2014059601 | 4/2014 |

OTHER PUBLICATIONS

"Office Action of China Related Application, Application No. 201910953430.8", dated Apr. 1, 2021, p. 1-p. 9.

* cited by examiner

SPLICED DISPLAY

CROSS REFERENCE TO RELATED APPLICATION

This application is a continuation-in-part application of and claims the priority benefit of U.S. application Ser. No. 16/231,404, filed on Dec. 22, 2018, now pending, which claims the priority benefit of Taiwan application serial no. 107135661, filed on Oct. 9, 2018. The entirety of each of the above-mentioned patent applications is hereby incorporated by reference herein and made a part of this specification.

TECHNICAL FIELD

The disclosure relates to a display, and more particularly, to a spliced display.

BACKGROUND

In order to provide a large-sized display surface, a known technique uses a splicing method to integrate a plurality of display units to display a screen together. For example, an existing video wall splicing technique involves stacking a plurality of small displays on each other to form a large video wall. However, the assembled structure between the frames of the displays and the adjacent displays causes gaps between the displays, so that the image screen displayed on the video wall is covered with a plurality of visible black lines, thereby affecting display quality. Moreover, the individual displays are spliced using the tiling frame, and the assembly process thereof is complicated and time-consuming. Moreover, with the developing trend of shrinking display pixel pitch, spliced displays are gradually being applied to small and medium-sized displays, such as personal computer display screens. Further, the consistency of brightness of each of the small displays and that of the whole large video wall are important factors of display quality. Therefore, the issues of traditional assembly splicing methods need to be solved to provide consumers with high quality and low-cost display products.

SUMMARY

The disclosure provides a spliced display with good display quality and simple assembly procedure.

A spliced display of the disclosure includes a transparent substrate, a plurality of micro (light-emitting diodes) LEDs, and a plurality of light sensors. The transparent substrate has a display surface and a back surface opposite to each other. The driving backplanes are disposed on the back surface of the transparent substrate to be spliced with each other. The micro LEDs are disposed on the driving backplanes respectively and located between the driving backplanes and the transparent substrate. Each of the driving backplanes is corresponding to parts of the micro LEDs. The light sensors are disposed on the transparent substrate and located between the micro LEDs and the transparent substrate. Each of the light sensors is adjacent to at least two of the micro LEDs, and at least one of the at least two of the micro LEDs is adjacent to two of the light sensor.

A spliced display of the disclosure includes a transparent substrate, a plurality of micro (light-emitting diodes) LEDs, and a plurality of light sensors. The transparent substrate has a display surface and a back surface opposite to each other. The driving backplanes are disposed on the back surface of the transparent substrate to be spliced with each other. The micro LEDs are disposed on the driving backplanes respectively and located between the driving backplanes and the transparent substrate. Each of the driving backplanes is corresponding to parts of the micro LEDs. The light sensors are disposed on the transparent substrate and located between the micro LEDs and the transparent substrate. Each of the light sensors is configured to sense a brightness of at least two of the micro LEDs, and the brightness of at least one of the at least two of the micro LEDs is sensed by two of the light sensors.

Based on the above, in the spliced display of the disclosure, a plurality of LED modules are disposed on a single transparent substrate, so that the LED modules may be spliced with each other without being assembled with each other using a tiling frame. Accordingly, there is no visible gap between adjacent LED modules from a tiling frame, and therefore the presence of visible black lines in the image displayed by the spliced display may be avoided to improve display quality. Moreover, since it is only necessary to bond the LED modules to the transparent substrate to complete splicing and the LED modules do not need to be assembled with each other using a tiling frame as in the prior art, the assembly process may be simplified. Further, under the arrangement of the light sensors and the micro LEDs, parts of the micro LEDs corresponding to a light sensor is also corresponding to another light sensor. Therefore, brightness of one or more of the micro LEDs located between two adjacent light sensors is sensed by the two adjacent light sensors in order, so as to adjust all the micro LEDs to have an identical brightness. In addition, since the spliced display includes the light sensors therein, it is no need to provide external light sensing device for adjusting the brightness of the micro LEDs, and the spliced display can perform brightness adjusting by itself immediately.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
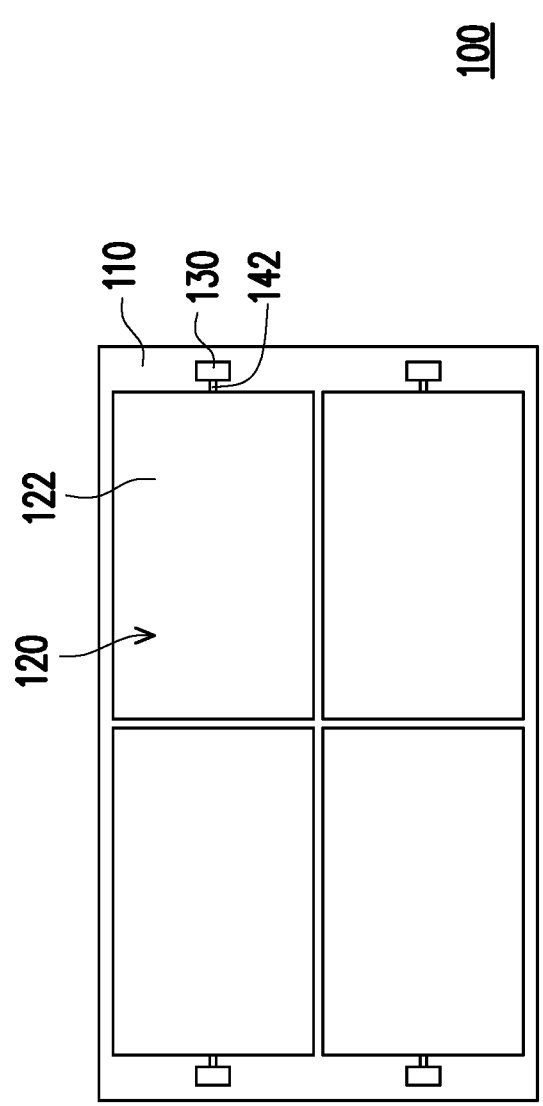
FIG. 1 is a rear view of a spliced display of an embodiment of the disclosure.
Figure 2:
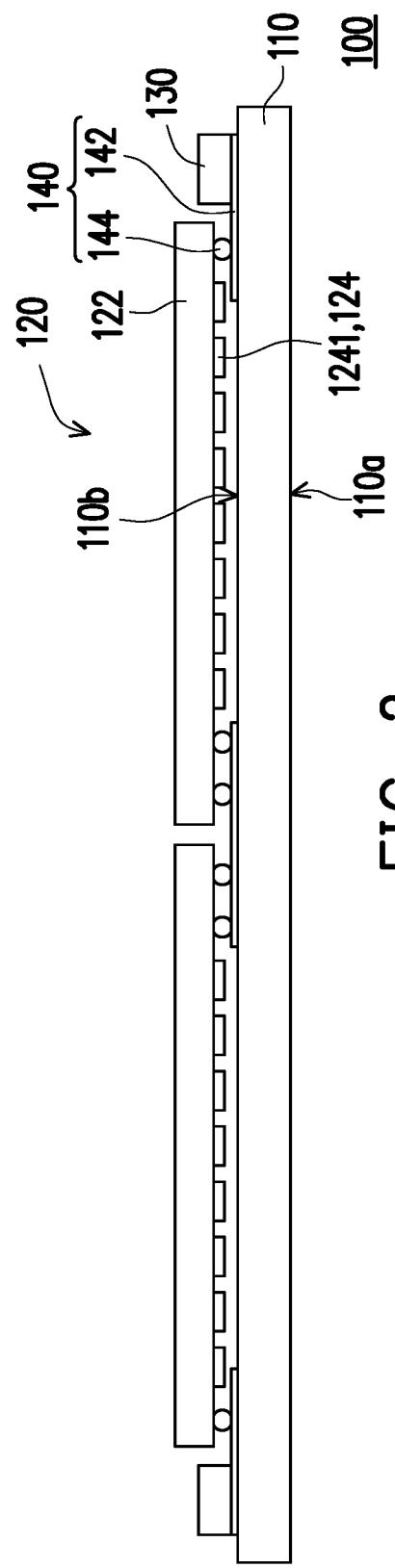
FIG. 2 is a cross section view of the spliced display of FIG. 1.

FIG. 1 is a rear view of a spliced display of an embodiment of the disclosure. FIG. 2 is a cross section of the spliced display of FIG. 1. Referring to FIG. 1 and FIG. 2, a spliced display 100 of the embodiment includes a transparent substrate 110, a plurality of light-emitting diode (LED) modules 120, at least one control element 130, and a signal transmission structure 140. The transparent substrate 110 is, for example, a transparent glass substrate or a transparent plastic substrate, and has a display surface 110a and a back surface 110b opposite to each other. The LED modules 120 are disposed on the back surface 110b of the transparent substrate 110 to be spliced with each other. In FIG. 1, the number of the LED modules 120 is four, but the disclosure is not limited thereto, and the number of the LED modules 120 may actually be more or less.

Each of the LED modules 120 includes a driving backplane 122 and a plurality of micro LEDs 1241, several micro LEDs 1241 (such as a red light LED, a green light LED and a blue light LED) constitutes a pixel 124. The driving backplanes 122 are disposed on the back surface 110b of the transparent substrate 110 and spliced with each other, each of the driving backplanes 122 is corresponding to parts of the micro LEDs 1241, and the micro LEDs 1241 are arranged in an array on the driving backplane 122 and face the back surface 110b of the transparent substrate 110. That is, the micro LEDs 1241 are located between the driving backplane 122 and the transparent substrate 110, and the light emitted by the micro LEDs 1241 is incident on the back surface 110b of the transparent substrate 110 and then exits the display surface 110a of the transparent substrate 110 to provide a display screen. The control element 130 includes, for example, a control circuit. In an embodiment of the disclosure, the control element 130 is disposed on an edge of the back surface 110b of the transparent substrate 110 and is connected to the LED modules 120 via the signal transmission structure 140, and the LED modules 120 are connected to each other via the signal transmission structure 140. The control element 130 is adapted to actively drive the micro LEDs 1241 to illuminate to display an image screen on the display surface 110a of the transparent substrate 110.

A plurality of LED modules 120 are disposed on a single transparent substrate 110 as described above, so that the LED modules 120 may be spliced with each other without being assembled with each other using a tiling frame. Accordingly, there is no visible gap between adjacent LED modules 120 from a tiling frame, and therefore the presence of visible lines (i.e. seams) in the image displayed by the spliced display 100 may be avoided to improve display quality. Moreover, since it is only necessary to bond the LED modules 120 to the transparent substrate 110 to complete splicing and the LED modules do not need to be assembled with each other using a tiling frame as in the prior art, the assembly process may be simplified.

In the embodiment, each of the LED modules 120 is bonded to the transparent substrate 110 by, for example, being absorbed by an automated absorption device and moved to a predetermined position of the back surface 110b of the transparent substrate 110, and the back surface 110b of the transparent substrate 110 may have an alignment pattern, a positioning groove (such as a positioning groove 110c to be described later), or other forms of alignment features for the alignment of each of the LED modules 120 to accurately bond each of the LED modules 120 to a predetermined position on the transparent substrate 110. In other embodiments, each of the LED modules 120 may be bonded to the transparent substrate 110 by other suitable means, and the disclosure is not limited in this regard.

In FIG. 1, the number of the control element 130 is four to respectively correspond to the LED modules 120. However, the disclosure is not limited thereto, and the number of the control element 130 may actually be different from the number of the LED modules 120. For example, the number of the control element 130 may be less than the number of the LED modules 120, and one control element 130 is used to drive the plurality of LED modules 120.

The signal transmission structure 140 of the embodiment is specifically described below. Referring to FIG. 2, the signal transmission structure 140 of the embodiment includes a circuit layer 142 and a plurality of conductive bumps 144. The conductive bumps 144 are respectively disposed on the driving backplane 122 and located between the driving backplane 122 and the back surface 110b of the transparent substrate 110. The circuit layer 142 is disposed on the back surface 110b of the transparent substrate 110 and electrically connected to the control element 130 and the conductive bumps 144. Therefore, the control element 130 may transmit a power signal and a driving signal to each of the LED modules 120 via the circuit layer 142 and the conductive bumps 144.

In the embodiment, the spliced display 100 may further include an adhesive layer for covering the micro LEDs 1241 and filled in the gaps between the LED modules 120. The adhesive layer is, for example, coated on the driving backplane 122 of each of the LED modules 120, and then extruded as each of the LED modules 120 and the transparent substrate 110 are bonded so as to be evenly distributed between the LED modules 120 and the transparent substrate 110 and be partially moved toward the gaps between the LED modules 120. The adhesive layer is, for example, an anisotropic conductive paste (ACP) or other types of conductive paste, such that the conductive bumps 144 are electrically connected to the circuit layer 142 via the adhesive layer. In particular, the anisotropic conductive paste may have conductive particles of a suitable particle size for conducting the conductive bumps 144 and the circuit layer 142 and preventing the micro LEDs 1241 and the transparent substrate 110 from being unintentionally turned on and causing a short circuit. Moreover, the LEDs 124 may have an insulating layer on the surface thereof to prevent the occurrence of a short circuit. However, the disclosure is not limited thereto, and the conductive bumps 144 may also be directly in contact with the circuit layer 142. Moreover, the adhesive layer is, for example, a semi-transparent black-dyed adhesive material, so that the display screen has good contrast.

Figure 3:
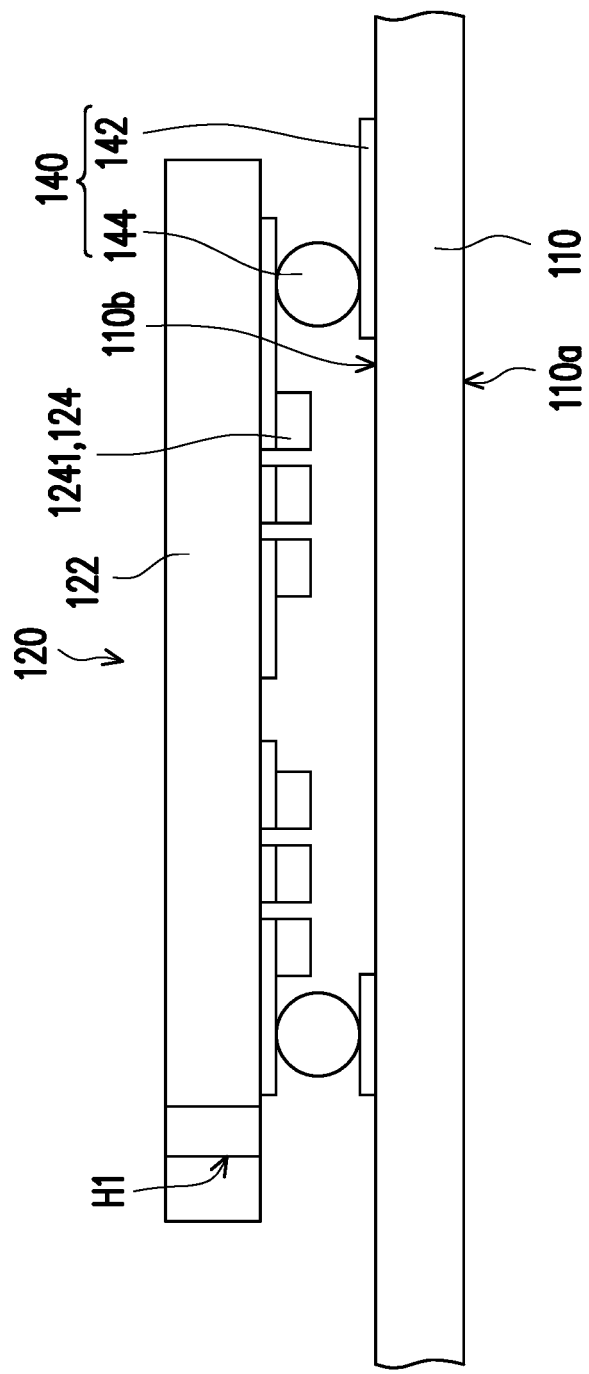
FIG. 3 is a partial cross section view of a spliced display of another embodiment of the disclosure.

FIG. 3 is a partial cross section of a spliced display of another embodiment of the disclosure. The difference between the embodiment shown in FIG. 3 and the embodiment shown in FIG. 2 is that the driving backplane 122 of FIG. 3 has at least one through-hole H1 for overflowed adhesive. During the extrusion of the adhesive layer as the LED modules 120 and the transparent substrate 110 are bonded, the excess portion of the adhesive layer may be discharged via the through-hole H1 for overflowed adhesive.

Figure 4:
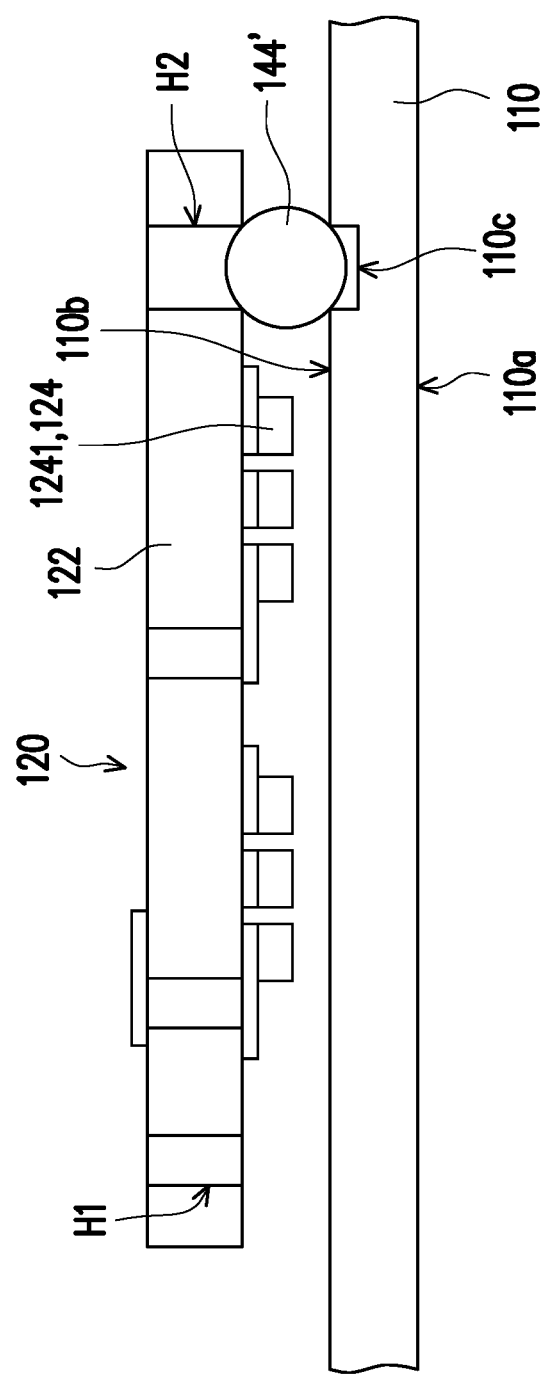
FIG. 4 is a partial cross section view of a spliced display of another embodiment of the disclosure.

FIG. 4 is a partial cross section of a spliced display of another embodiment of the disclosure. The difference between the embodiment shown in FIG. 4 and the embodiment shown in FIG. 3 is that the LED modules 120 of FIG. 4 include at least one positioning bump 144', the driving backplane 122 further has at least one positioning through-hole H2, and the positioning bumps 144' are positioned at one end of the positioning through-hole H2. Moreover, the back surface 110b of the transparent substrate 110 may have a positioning groove 110c as shown in FIG. 4, and the positioning bumps 144' are also positioned at the positioning groove 110c. Therefore, the LED modules 120 may be accurately bonded to the transparent substrate 110.

Figure 5:
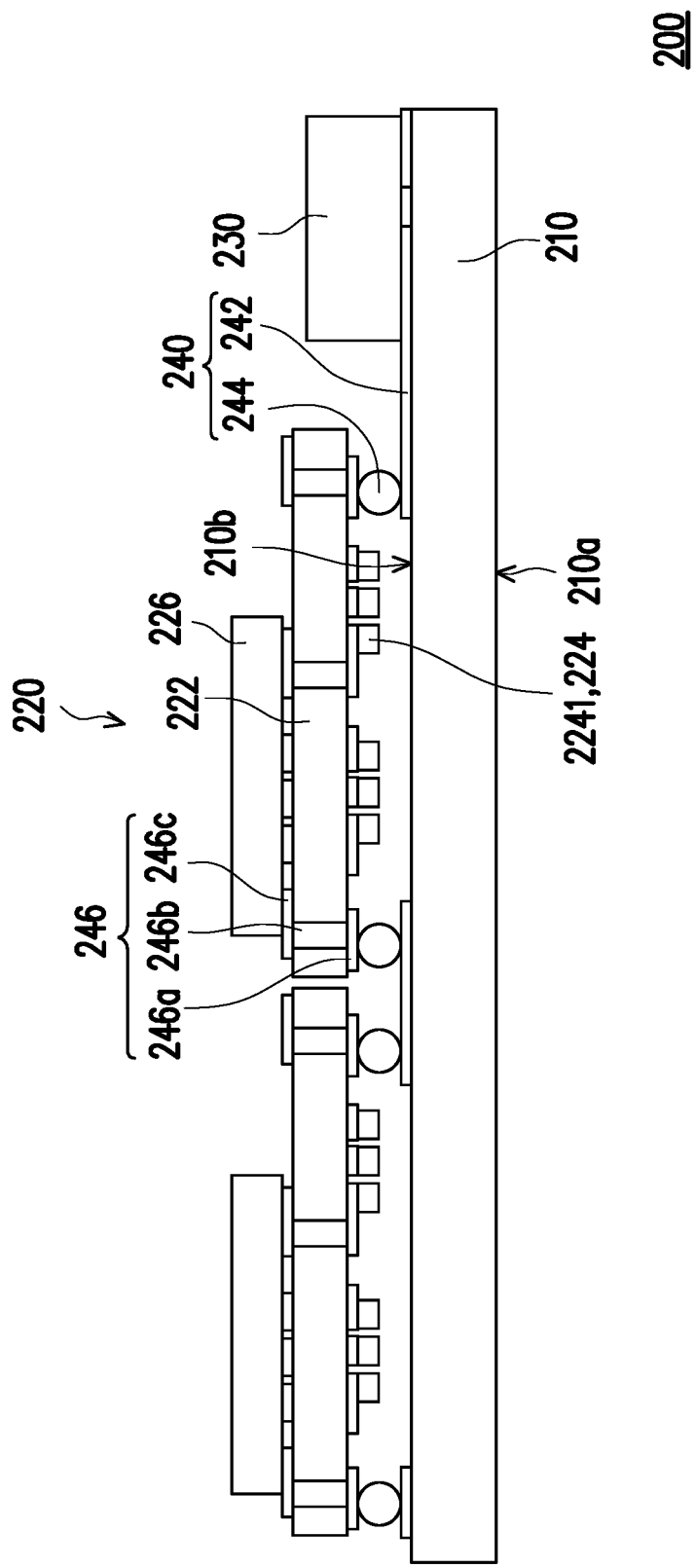
FIG. 5 is a cross section view of a spliced display of another embodiment of the disclosure.

FIG. 5 is a cross section of a spliced display of another embodiment of the disclosure. In a spliced display 200 of FIG. 5, the configurations and operations of a transparent substrate 210, a display surface 210a, a back surface 210b, LED modules 220, driving backplane 222, micro LEDs 2241 (pixels 224), a control element 230, a signal transmission structure 240, a circuit layer 242, and conductive bumps 244 are similar to the configurations and operations of the transparent substrate 110, the display surface 110a, the back surface 110b, the LED modules 120, the driving backplanes 122, the micro LEDs 1241, the control element 130, the signal transmission structure 140, the circuit layer 142, and the conductive bumps 144 of FIG. 2 and are not repeated herein.

The difference between the spliced display 200 and the spliced display 100 is that each of the LED modules 220 further includes at least one driving element 226, and the driving element 226 includes, for example, a driving circuit and is disposed on the driving backplane 222, and the control element 230 is adapted to control the driving element 226 to drive the micro LEDs 2241. Therefore, the signal transmission structure 240 of the embodiment further includes a plurality of circuit structures 246 respectively corresponding to the LED modules 220. The circuit structures 246 are respectively disposed on the driving backplanes 222, and each of the circuit structures 246 is connected to the corresponding driving element 226 and the corresponding micro LEDs 2241. Thus, the driving element 226 may transmit a drive signal to the micro LEDs 2241 via the circuit structures 246.

Specifically, the circuit structures 246 include, for example, a first circuit layer 246a, a conductive through-hole 246b, and a second circuit layer 246c. The first circuit layer 246a and the second circuit layer 246c are respectively disposed on two opposite surfaces of the driving backplane 222 and are respectively connected to the conductive bumps 244 and the driving element 226, and the conductive through-hole 246b passes through the driving backplane 222 and is connected between the first circuit layer 246a and the second circuit layer 246c. In other embodiments, the circuit structures 246 may have other suitable configurations, and the disclosure is not limited in this regard.

Figure 6:
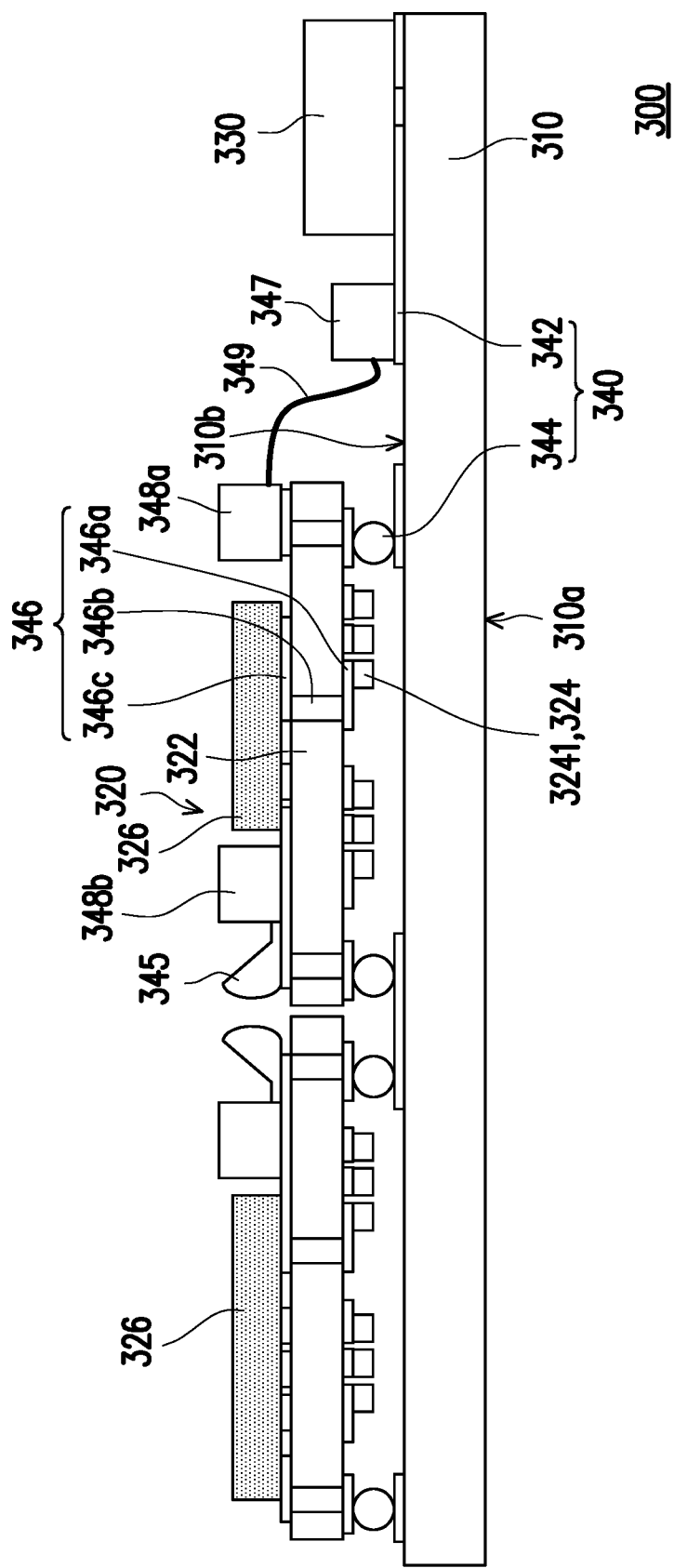
FIG. 6 is a cross section view of a spliced display of another embodiment of the disclosure.
Figure 7:
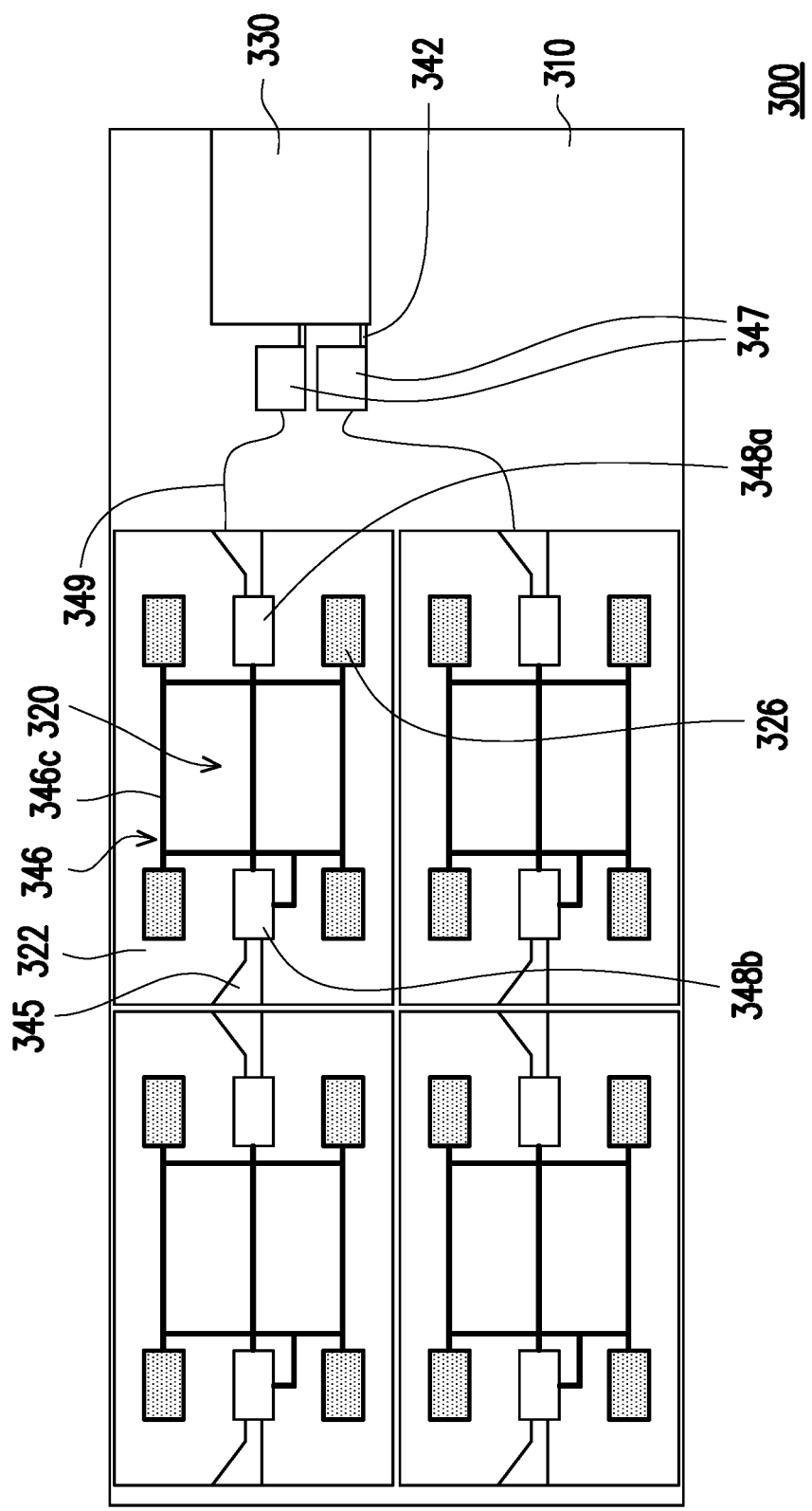
FIG. 7 is a rear view of the spliced display of FIG. 6.

FIG. 6 is a cross section of a spliced display of another embodiment of the disclosure. FIG. 7 is a rear view of the spliced display of FIG. 6. In a spliced display 300 of FIG. 6 and FIG. 7, the configurations and operations of a transparent substrate 310, a display surface 310a, a back surface 310b, LED modules 320, driving backplanes 322, micro LEDs 3241 (pixels 324), a driving element 326, a control element 330, a signal transmission structure 340, a circuit layer 342, conductive bumps 344, circuit structures 346, a first circuit layer 346a, a conductive through-hole 346b, and a second circuit layer 346c are similar to the configurations and operations of the transparent substrate 210, the display surface 210a, the back surface 210b, the LED modules 220, the driving backplanes 222, the micro LEDs 2241, the driving element 226, the control element 230, the signal transmission structure 240, the circuit layer 242, the conductive bumps 244, the circuit structures 246, the first circuit layer 246a, the conductive through-hole 246b, and the second circuit layer 246c in the spliced display 200 of FIG. 5 and are not repeated herein.

The difference between the spliced display 300 and the spliced display 200 is that the signal transmission structure 340 further includes at least one first photoelectric conversion element 347 (shown as two), a plurality of second photoelectric conversion elements 348a and 348b, and a plurality of optical waveguides 349. The first photoelectric conversion elements 347 are disposed on the back surface 310b of the transparent substrate 310 and is connected to the control element 330. The second photoelectric conversion elements 348a and 348b are respectively disposed on the driving backplane 322, the second photoelectric conversion elements 348a and 348b on the same driving backplane 322 are connected to each other, and the second photoelectric conversion element 348a on the driving backplanes 322 adjacent to the first photoelectric conversion elements 347 is connected to the first photoelectric conversion elements 347 via the optical waveguides 349. The first photoelectric conversion elements 347 convert a control signal from the control element 330 from an electrical signal into an optical signal and transmits the control signal to the second photoelectric conversion element 348a on the adjacent driving backplane 322 via the optical waveguides 349. The second photoelectric conversion element 348a is used, for example, to convert an optical signal into an electrical signal, the second photoelectric conversion element 348b is used, for example, to convert an electrical signal into an optical signal, and the second circuit layer 346c is used for the electrical signal connection between the driving element 326 and the second photoelectric conversion elements 348a and 348b, so that the driving element 326 drives the corresponding micro LEDs 3241. Since in the embodiment, the control signal from the control element 330 is transmitted to the LED modules 320 using the first photoelectric conversion elements 347, the electrical transmission path formed by the circuit layer 342 and the conductive bumps 344 may be used only to provide power to the LED modules 320.

More specifically, the signal transmission structure 340 further includes a plurality of optical coupling elements 345, and the optical coupling elements 345 are, for example, optical couplers or other suitable forms of light-transmitting elements respectively disposed on the driving backplanes 322 and respectively directly connected to the corresponding second photoelectric conversion element 348b. At least one of the optical coupling elements 345 on each of the driving backplanes 322 is aligned with at least one of the optical coupling elements 345 on an adjacent driving backplane 322 to enable the optical signal to be transmitted between two optical coupling elements 345 aligned with each other on two adjacent driving backplanes 322. Therefore, the optical signal from the first photoelectric conversion elements 347 may be transmitted to the LED modules 320 away from the first photoelectric conversion elements 347 via the optical coupling elements 345 (i.e., the two LED modules on the left in FIG. 7).

It should be noted that the number and position of the driving element 326 of each of the LED modules 320 shown in FIG. 6 are only illustrative, and the actual number and position thereof may be four as shown in FIG. 7 and the driving elements 326 are not located in the center of the driving backplanes 322. Moreover, the connection between the first photoelectric conversion elements 347 and the second photoelectric conversion element 348a shown in FIG. 6 is only illustrative, and the second photoelectric conversion element 348a is actually disposed with the optical coupling elements 345 as shown in FIG. 7 to make all of the elements on the driving backplanes 322 more symmetrical in order to facilitate mass production. However, the disclosure is not limited thereto. In other embodiments, the second photoelectric conversion element 348a may also be disposed without the optical coupling elements 345.

Figure 8:
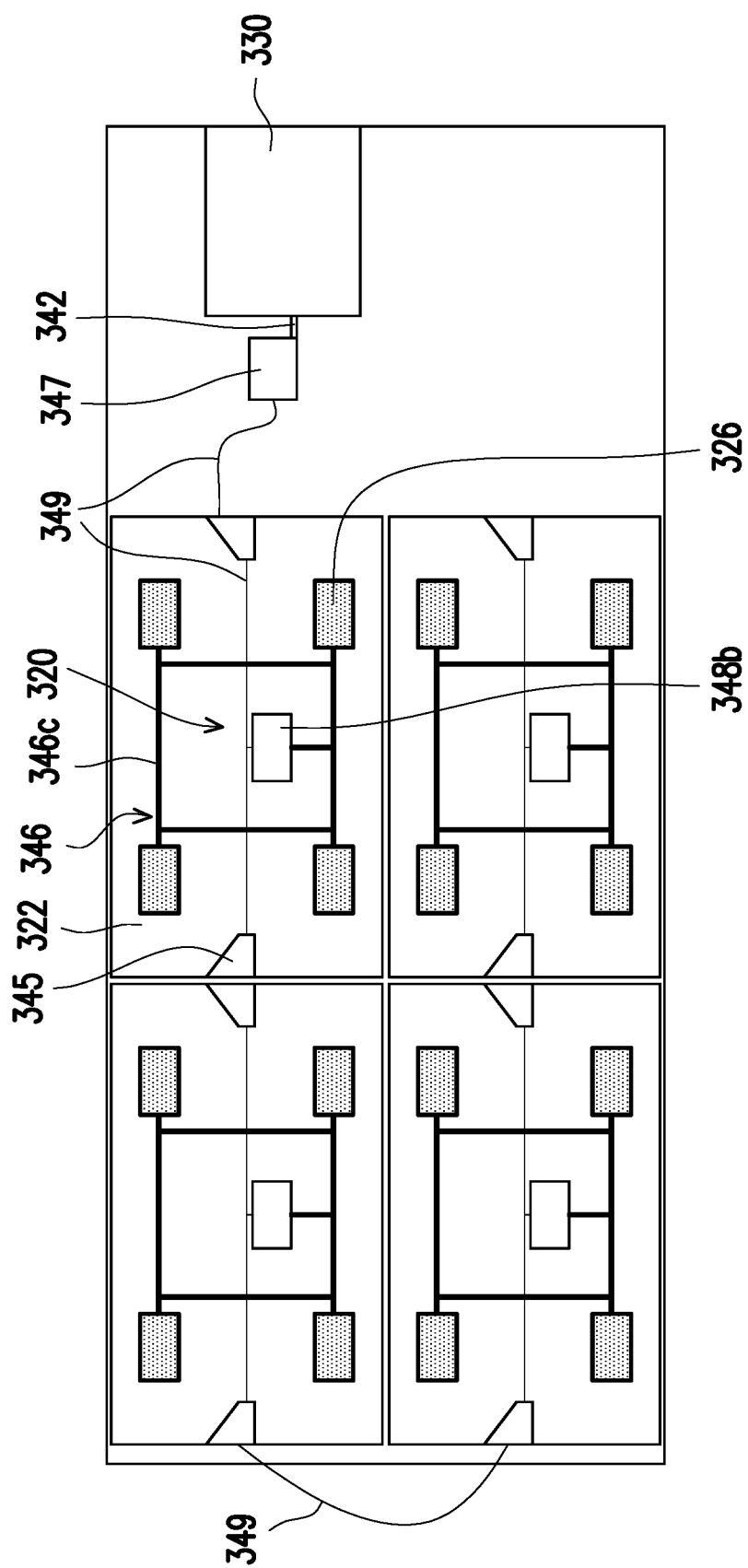
FIG. 8 is a rear view of a spliced display of another embodiment of the disclosure.

FIG. 8 is a rear view of a spliced display of another embodiment of the disclosure. The difference between the embodiment shown in FIG. 8 and the embodiment shown in FIG. 7 is that only one second photoelectric conversion element 348b is disposed on each of the driving backplanes 322 of FIG. 8, and each of the optical coupling elements 345 is connected to the corresponding second photoelectric conversion element 348b via the corresponding optical waveguide 349. Moreover, the number of the first photoelectric conversion element 347 of FIG. 8 is one, and two of the optical coupling elements 345 of two of the LED modules 320 (i.e., the two LED modules 320 on the left in FIG. 8) away from the first photoelectric conversion element 347 are connected to each other via the optical waveguides 349, so that the optical signal from the first photoelectric conversion element 347 may be sequentially transmitted to each of the LED modules 320.

Figure 9:
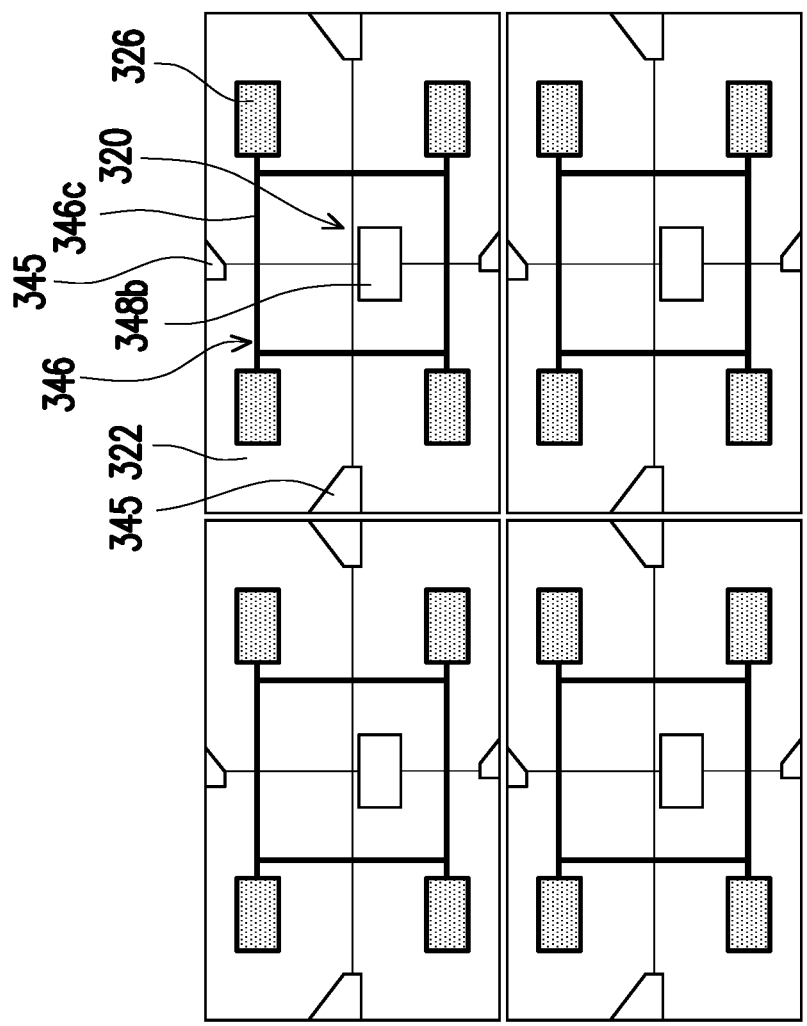
FIG. 9 is a rear view of some of the components of a spliced display of another embodiment of the disclosure.

FIG. 9 is a rear view of some of the components of a spliced display of another embodiment of the disclosure. The difference between the embodiment shown in FIG. 9 and the embodiment shown in FIG. 8 is that in addition to disposing the optical coupling elements 345 at the left and right ends of each of the driving backplanes 322 of FIG. 9, the optical coupling elements 345 are further disposed at the upper and lower ends thereof. As a result, each of the LED modules 320 may perform optical signal transmission directly with all of the LED modules 320 adjacent thereto.

Figure 10:
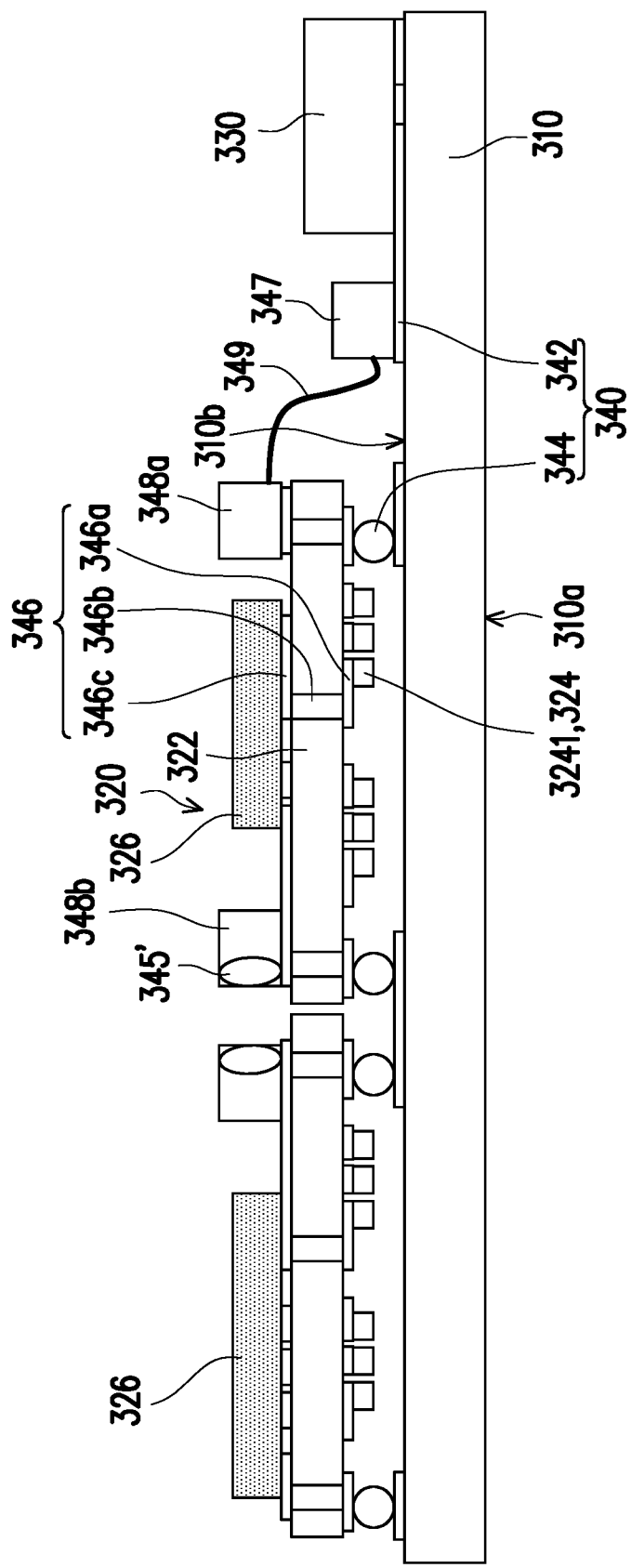
FIG. 10 is a cross section view of a spliced display of another embodiment of the disclosure.

FIG. 10 is a cross section of a spliced display of another embodiment of the disclosure. The difference between the embodiment shown in FIG. 10 and the embodiment shown in FIG. 6 is that optical coupling elements 345' of FIG. 10 are coupling lenses, and the coupling lenses are integrated in the second photoelectric conversion element 348b. In other embodiments, the optical coupling elements may be in other suitable forms, and the disclosure is not limited in this regard.

Figure 11:
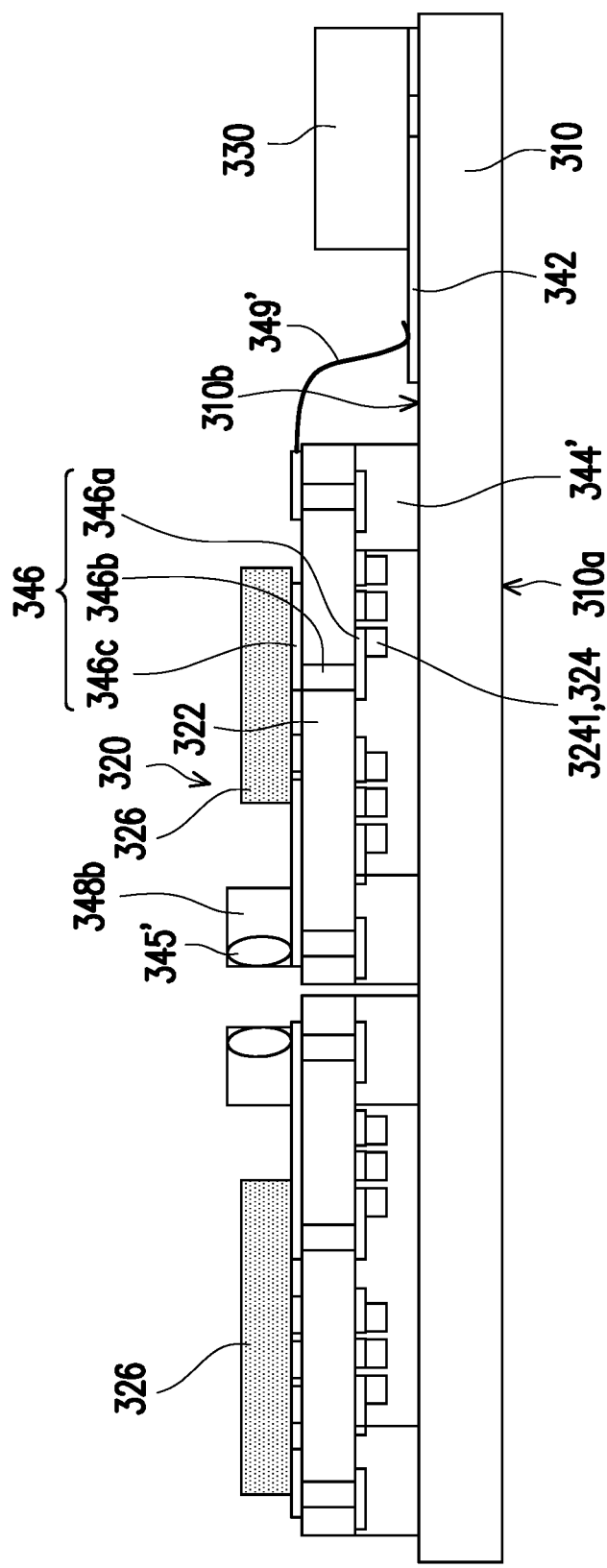
FIG. 11 is a cross section view of a spliced display of another embodiment of the disclosure.

FIG. 11 is a cross section of a spliced display of another embodiment of the disclosure. The difference between the embodiment shown in FIG. 11 and the embodiment shown in FIG. 10 is that the LED modules 320 of FIG. 11 do not have the conductive bumps 344 shown in FIG. 10, and instead spacers 344' connected between the driving backplanes 322 and the back surface 310a of the transparent substrate 310 are provided. The spacers 344' provide structural support between the driving backplanes 322 and the transparent substrate 310 without the function of transmitting power signals and control signals. Power signals and control signals are transmitted between the control element 330 and the adjacent LED modules 320 thereof via, for example, a flexible printed circuit (FPC) 349' or other suitable forms of electrical transmission element.

In each of the above embodiments, the adjacent LED modules have gaps at junctions thereof, and in order to prevent the gaps from causing the display screen to be visually discontinuous at the junctions of the LED modules, the pixels located at the junctions of the LED modules may be designed to have a small width, so that the pixel pitch of all pixels is the same. This is specifically described below with reference to the embodiments shown in FIG. 1 and FIG. 2.

Figure 12:
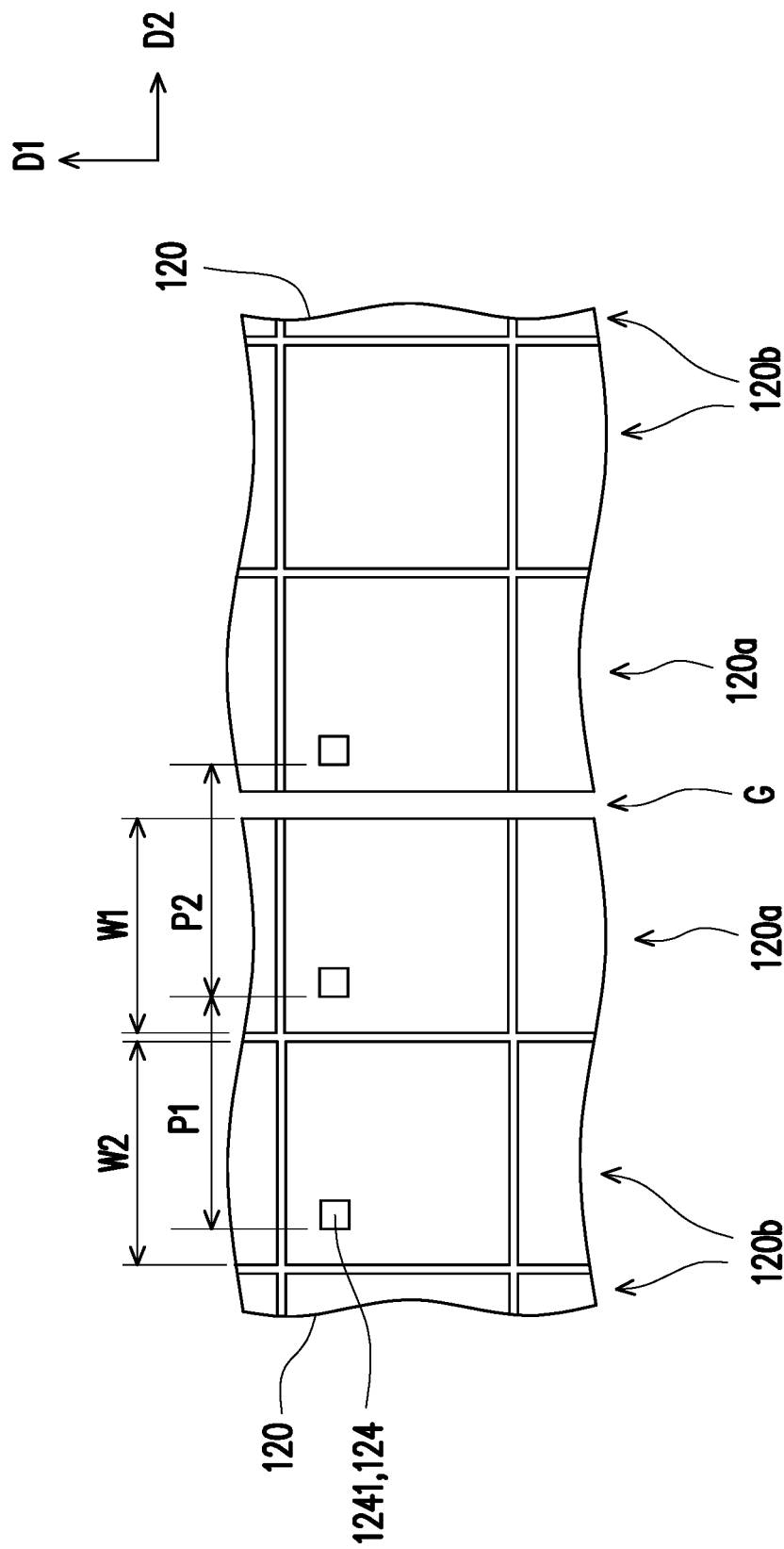
FIG. 12 is a partial enlarged view of the junctions of the LED modules of FIG. 1.

FIG. 12 is a partial enlarged view of the junctions of the LED modules of FIG. 1. Referring to FIG. 12, each of the LED modules 120 has a plurality of pixels arranged in an array, the pixels include a plurality of first pixels 120a and a plurality of second pixels 120b, and each of the pixels includes a portion of the micro LEDs 1241. To make the drawing clearer, FIG. 12 shows only a few micro LEDs 1241. The first pixels 120a of each of the LED modules 120 are arranged along a first direction D1 and adjacent to another LED module 120, and the first pixels 120a of each of the LED modules 120 are located between the second pixels 120b and the other LED module 120. That is, the first pixels 120a are pixels located at the outermost periphery of the LED modules 120, and the second pixels 120b are the other pixels not located at the outermost periphery of the LED modules 120. Therefore, a width W1 of each of the first pixels 120a along a second direction D2 perpendicular to the first direction D1 may be designed to be smaller than a width W2 of each of the second pixels 120b along the second direction D2. Therefore, even if there is a gap G between two adjacent LED modules 120, a pixel pitch P2 of two adjacent pixels respectively located at the edge of the two LED modules 120 may be maintained as a pixel pitch P1 of two adjacent pixels of the same LED module 120 to avoid visual discontinuity of the display screen at the junctions of the LED modules. For example, if the width W2 of the second pixels 120b is 200 micrometers, then the width W1 of the first pixels 120a may be reduced to 196 micrometers, and the disclosure is not limited in this regard.

Figure 13:
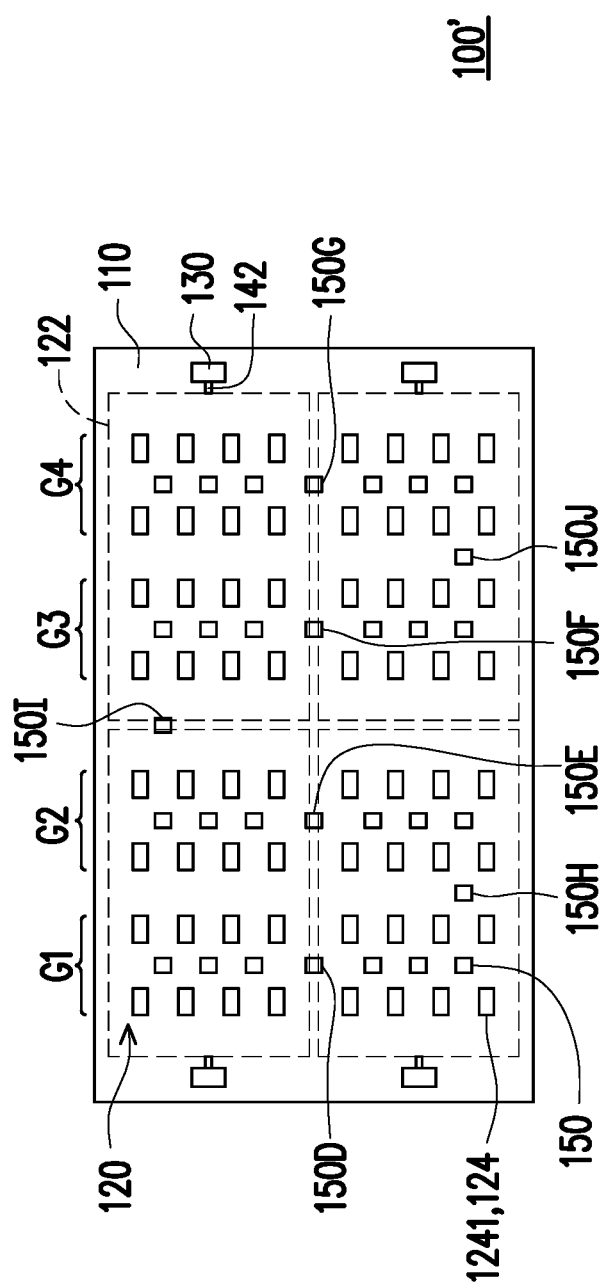
FIG. 13 is a rear view of a spliced display of another embodiment of the disclosure.
Figure 14:
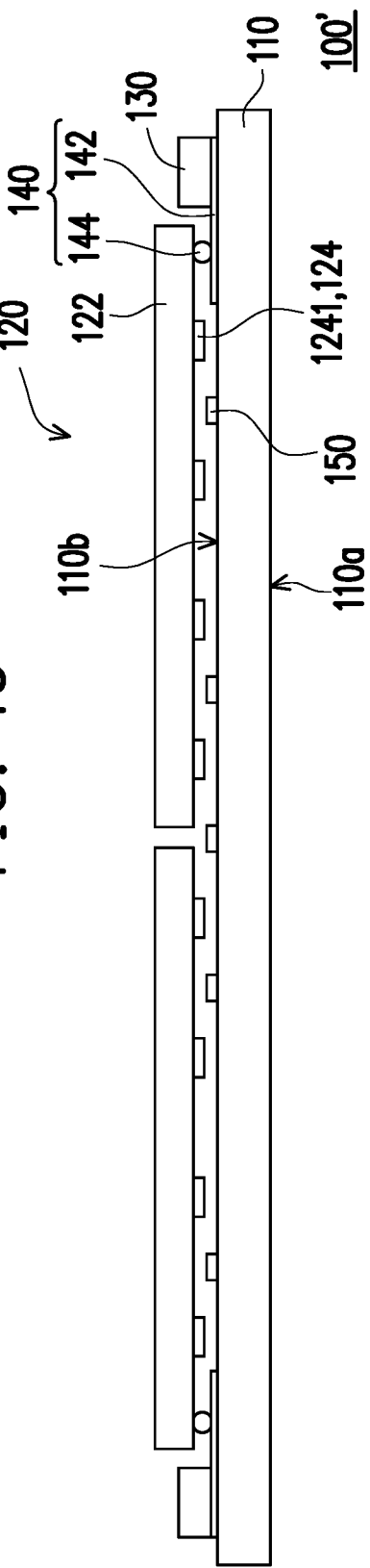
FIG. 14 is a cross section view of the spliced display of FIG. 13.
Figure 15:
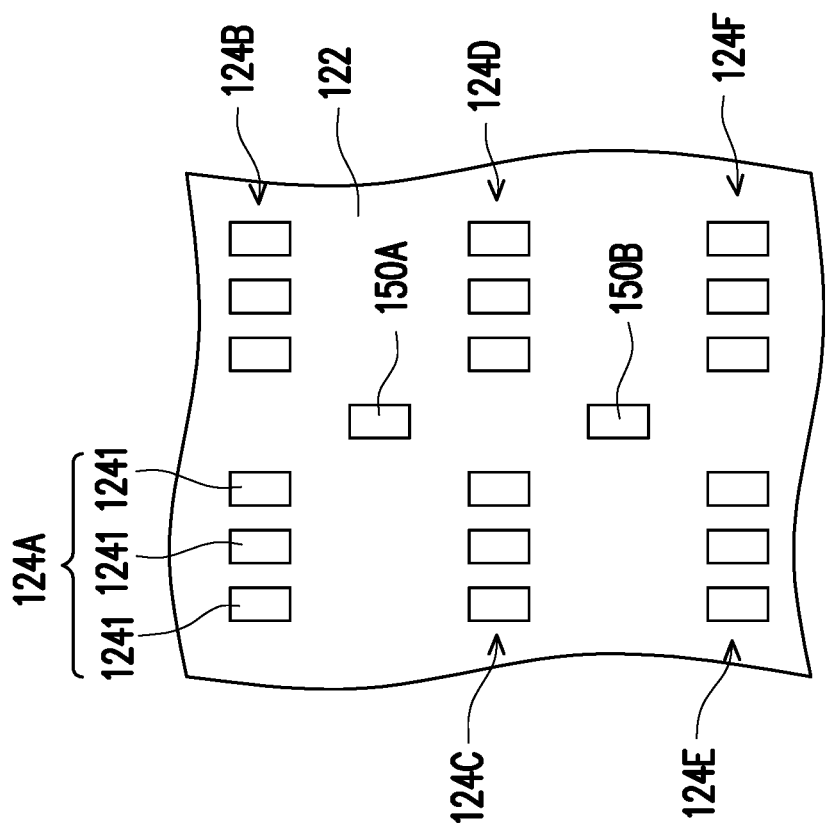
FIG. 15 is a partial view of the spliced display of FIG. 14.

FIG. 13 is a rear view of a spliced display of another embodiment of the disclosure. FIG. 14 is a cross section view of the spliced display of FIG. 13. FIG. 15 is a partial view of the spliced display of FIG. 14. Referring to FIGS. 13 to 15, the difference between the embodiment shown in FIGS. 13 to 15 and the embodiment t shown in FIGS. 1 and 2 is that, the spliced display 100' in FIGS. 13 to 15 further includes a plurality of light sensors 150 for calibration. The light sensors 150 are disposed on the back surface 110b of the transparent substrate 110 to be located between the micro LEDs 1241 and the transparent substrate 110. Since the micro LEDs 1241 respectively disposed on the driving backplanes 124 face the back surface 110b of the transparent substrate 110 and the light sensors 150 are disposed on the back surface 110b of the transparent substrate 110, the micro LEDs 1241 and the light sensors 150 are located on different planes respectively and opposite to each other. When viewed in a viewing direction orthogonal to the display surface 110a and the back surface 110b (such as the rear view as shown in FIG. 13), each of the light sensors 150 is adjacent to at least two of the micro LEDs 1241, and at least one of the at least two of the micro LEDs 1241 is adjacent to two of the light sensors 150. Accordingly, each of the light sensors 150 is configured to sense a brightness of at least two of the micro LEDs 1241, and the brightness of at least one of the at least two of the micro LEDs 1241 is sensed by two of the light sensors 150.

That is, when viewed in a viewing direction orthogonal to the display surface 110a and the back surface 110b, each adjacent two of the light sensors 150 are arranged with at least one of the micro LEDs 1241 located therebetween. Accordingly, each adjacent two of the light sensors 150 are configured to sense a brightness of at least one of the micro LEDs 1241 located therebetween.

Under the above-mentioned arrangement of the light sensors 150 and the micro LEDs 1241, parts of the micro LEDs 1241 corresponding to a light sensor 150 is also corresponding to another light sensor 150. Therefore, brightness of one or more of the micro LEDs 1241 located between two adjacent light sensors 150 is sensed by the two adjacent light sensors 150 in order, so as to adjust all the micro LEDs 150 to have an identical brightness. In addition, since the spliced display 100' includes the light sensors 150 therein, it is no need to provide external light sensing device for adjusting the brightness of the micro LEDs 1241, and the spliced display 100' can perform brightness adjusting by itself immediately.

As shown in FIG. 13, in this embodiment, when viewed in a viewing direction orthogonal to the display surface 110*a* and the back surface 110*b*, each of the light sensors 150 is located between adjacent four of the pixels 124, and two of the adjacent four of the pixels 124 are located between two of the light sensors 150.

Further, parts of the light sensors 150 are arranged along the gap between adjacent two of the driving backplanes 122 to be corresponding to the adjacent pixels 124 located on the adjacent two driving backplanes 122 respectively. In detail, four of the light sensors (labeled as light sensors 150D~150G in FIG. 13) respectively arranged in the regions of groups G1 to G4 of the micro LEDs 1241 are located at the gap. In addition, one of the light sensors (labeled as light sensor 150H in FIG. 13) is arranged between groups G1 and G2 of the micro LEDs 1241, another one of the light sensors (labeled as light sensor 150I in FIG. 13) is arranged between group G2 and G3 of the micro LEDs 1241 and is located at the gap, and further another one of the light sensors (labeled as light sensor 150J in FIG. 13) is arranged between groups G3 and G4 of the micro LEDs 1241. According to this arrangement, groups G1 and G2 of the micro LEDs 1241 are related with each other in brightness sensing and calibrating by the light sensor 150H, and the light sensors 150I and 150J each has a similar function as the light sensor 150H does. As such, the brightness of all the micro LEDs 1241 can be calibrated mutually through the light sensors 150.

The number of the light sensor 150H arranged between the groups G1 and G2 is not limited thereto. In other embodiments, two or more light sensors 150H can be arranged between the groups G1 and G2 of the micro LEDs 1241. So does the light sensors 150I/150J.

Specifically, as shown in FIG. 15, the micro LEDs 1241 comprises a plurality of pixels (shown as pixels 124A-124F), each of the pixels 124A-124F is constituted by several micro LEDs 1241 (such as a red light LED, a green light LED and a blue light LED). When viewed in a viewing direction orthogonal to the display surface 110*a* and the back surface 110*b*, the light sensor 150A is located between adjacent four pixels 124A-124D, the light sensor 150B is located between adjacent four pixels 124C-124F, two pixels 124C and 124D are located between light sensor 150A and light sensor 150B. In the brightness sensing and adjusting process, the light sensor 150A senses the brightness of the pixels 124A-124D for the control element 130 to adjust the brightness of the pixels 124A-124D to be identical. Then, the light sensor 150B senses the brightness of the pixels 124C-124F for the control element 130 to adjust the brightness of the pixels 124C-124F to be identical based on the brightness of the pixels 124C and 124D. As a result, the brightness of the pixels 124A-124F are adjusted to be identical by performing the above-mentioned brightness sensing and adjusting process. By the same sensing and adjusting manner, even if different light sensors 150 are not calibrated before the sensing and adjusting process, the brightness of all the micro LEDs 1241 of the spliced display 100' can be adjusted to be identical. In the above-mentioned embodiment, each of the light sensors 150 is corresponding to four pixels 124, but the invention is not limited thereto. In other embodiment, each of the light sensors 150 can be arranged as corresponding to other quantities of at least two pixels.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A spliced display, comprising:
   a transparent substrate having a display surface and a back surface opposite to each other;
   a plurality of driving backplanes, disposed on the back surface of the transparent substrate and spliced with each other;
   a plurality of micro (light-emitting diodes) LEDs, disposed on the driving backplanes respectively and located between the driving backplanes and the transparent substrate, wherein each of the driving backplanes is corresponding to parts of the micro LEDs; and
   a plurality of light sensors, disposed on the transparent substrate and located between the micro LEDs and the transparent substrate, wherein each of the light sensors is adjacent to at least two of the micro LEDs, and at least one of the at least two of the micro LEDs is adjacent to two of the light sensors,
   wherein the micro LEDs and the light sensors are located on different carriers respectively, wherein the driving backplanes and the transparent substrate form the different carriers respectively,
   wherein at least parts of the light sensors and the driving backplanes overlap in a direction perpendicular to the display surface.

2. The splice display of claim 1, wherein the micro LEDs comprises a plurality of pixels, each of the light sensors is located between adjacent four of the pixels, and two of the adjacent four of the pixels are located between two of the light sensors.

3. The splice display of claim 1, comprising a plurality of LED modules, at least one control element and a signal transmission structure, wherein each of the LED modules comprises one of the driving backplanes and parts of the micro LEDs, the at least one control element is disposed on the transparent substrate, the at least one control element is connected to the plurality of LED modules via the signal transmission structure, and the plurality of LED modules are connected to each other via the signal transmission structure.

4. The spliced display of claim 3, wherein the at least one control element is disposed on an edge of the back surface of the transparent substrate.

5. The spliced display of claim 3, wherein the signal transmission structure comprises a circuit layer and a plurality of conductive bumps, the plurality of conductive bumps are respectively disposed between the driving backplanes and the transparent substrate, and the circuit layer is disposed on the back surface of the transparent substrate and electrically connected to the at least one control element and the plurality of conductive bumps.

6. The spliced display of claim 5, wherein each of the plurality of LED modules comprises at least one positioning bump, each of the driving backplanes has at least one positioning through-hole, and the at least one positioning bump is located at an end of the at least one positioning through-hole.

7. The spliced display of claim 1, comprising an adhesive layer, wherein the adhesive layer covers the plurality of micro LEDs and is filled in a gap between the plurality of LED modules.

8. The spliced display of claim 3, wherein the at least one control element is adapted to actively drive the plurality of micro LEDs.

9. The spliced display of claim 3, wherein each of the plurality of LED modules comprises at least one driving element, the at least one driving element is disposed on the driving backplane, and the at least one control element is adapted to control the at least one driving element to drive the plurality of micro LEDs.

10. The spliced display of claim 9, wherein the signal transmission structure comprises a plurality of circuit structures, the plurality of circuit structures are respectively disposed on the driving backplanes, and each of the plurality of circuit structures is connected to at least one corresponding driving element and the plurality of corresponding micro LEDs.

11. The spliced display of claim 10, wherein the signal transmission structure comprises at least one first photoelectric conversion element, a plurality of second photoelectric conversion elements, and a plurality of optical waveguides, the at least one first photoelectric conversion element is disposed on the transparent substrate and connected to the at least one control element, the plurality of second photoelectric conversion elements are respectively disposed on the driving backplanes, the plurality of second photoelectric conversion elements on the driving backplanes are connected to each other by at least one of the optical waveguides, the second photoelectric conversion element on the driving backplane adjacent to the first photoelectric conversion element is connected to the first photoelectric conversion element by at least one of the optical waveguides, and each of the plurality of second photoelectric conversion elements is connected to at least one corresponding driving element by a corresponding circuit structure.

12. The spliced display of claim 11, wherein the signal transmission structure comprises a plurality of optical coupling elements, the plurality of optical coupling elements are respectively disposed on the driving backplanes and respectively connected to the plurality of corresponding second photoelectric conversion elements, and at least one of the optical coupling elements on each of the driving backplanes is aligned with at least one of the optical coupling elements on an adjacent driving backplane.

13. The spliced display of claim 12, wherein each of the plurality of optical coupling elements is directly connected to the corresponding second photoelectric conversion element.

14. The spliced display of claim 12, wherein each of the optical coupling elements is connected to the corresponding second photoelectric conversion element by a corresponding optical waveguide.

15. The spliced display of claim 1, wherein each of the plurality of LED modules comprises at least one spacer, and the at least one spacer is connected between the driving backplane and the back surface of the transparent substrate.

16. The splice display of claim 1, wherein each of the plurality of LED modules has a plurality of pixels arranged in an array, each of the plurality of pixels comprises a portion of the plurality of micro LEDs, the plurality of pixels comprise a plurality of first pixels and a plurality of second pixels, the plurality of first pixels are adjacent to another of the plurality of LED modules and located between the plurality of second pixels and the other LED module, and a width of each of the plurality of first pixels is smaller than a width of each of the plurality of second pixels.

17. The splice display of claim 16, wherein the plurality of first pixels are arranged along a first direction, the plurality of second pixels are arranged along the first direction, and the width of each of the plurality of first pixels in a second direction perpendicular to the first direction is smaller than the width of each of the plurality of second pixels along the second direction.

18. A spliced display, comprising:
a transparent substrate having a display surface and a back surface opposite to each other;
a plurality of driving backplanes, disposed on the back surface of the transparent substrate and spliced with each other;
a plurality of micro (light-emitting diodes) LEDs, disposed on the driving backplanes respectively and located between the driving backplanes and the transparent substrate, wherein each of the driving backplanes is corresponding to parts of the micro LEDs; and
a plurality of light sensors, disposed on the transparent substrate and located between the micro LEDs and the transparent substrate, wherein each of the light sensors is configured to sense a brightness of at least two of the micro LEDs, and the brightness of at least one of the at least two of the micro LEDs is sensed by two of the light sensors,
wherein the micro LEDs and the light sensors are located on different carriers respectively, wherein the driving backplanes and the transparent substrate form the different carriers respectively,
wherein at least parts of the light sensors and the driving backplanes overlap in a direction perpendicular to the display surface.

19. The splice display of claim 18, wherein after one of the light sensors senses the brightness of the at least two of the micro LEDs, another one of the light sensors senses the brightness of the at least one of the at least two of the micro LEDs.

20. A spliced display, comprising:
a transparent substrate having a display surface and a back surface opposite to each other;
a plurality of driving backplanes, disposed on the back surface of the transparent substrate and spliced with each other;
a plurality of micro (light-emitting diodes) LEDs, disposed on the driving backplanes respectively and located between the driving backplanes and the transparent substrate, wherein each of the driving backplanes is corresponding to parts of the micro LEDs; and
a plurality of light sensors, disposed on the transparent substrate and located between the micro LEDs and the transparent substrate, wherein each of the light sensors is adjacent to at least two of the micro LEDs, and at least one of the at least two of the micro LEDs is adjacent to two of the light sensors,
wherein the micro LEDs and the light sensors are located on different carriers respectively, wherein the driving backplanes and the transparent substrate form the different carriers respectively, wherein the brightness of at least one of the at least two of the micro LEDs is sensed by two of the light sensors in order.

* * * * *

UNITED STATES PATENT AND TRADEMARK OFFICE
CERTIFICATE OF CORRECTION

PATENT NO. : 11,810,484 B2
APPLICATION NO. : 17/483812
DATED : November 7, 2023
INVENTOR(S) : Chia-Hsin Chao et al.

It is certified that error appears in the above-identified patent and that said Letters Patent is hereby corrected as shown below:

On the Title Page

Item (30) Foreign Application Priority Data should read: Oct. 9, 2018 (TW) ......107135661

Signed and Sealed this
Ninth Day of January, 2024

Katherine Kelly Vidal
*Director of the United States Patent and Trademark Office*